United States Patent [19]

Hollis et al.

[11] Patent Number: 4,839,310

[45] Date of Patent: Jun. 13, 1989

[54] HIGH MOBILITY TRANSISTOR WITH OPPOSED-GATES

[75] Inventors: Mark A. Hollis, Concord; William D. Goodhue; Kirby B. Nichols, both of Chelmsford; Normand J. Bergeron, Jr., New Bedford, all of Mass.

[73] Assignee: Massachusetts Institute of Technology, Cambridge, Mass.

[21] Appl. No.: 149,125

[22] Filed: Jan. 27, 1988

[51] Int. Cl.$^4$ .................................................. H01L 29/80
[52] U.S. Cl. ....................................... 437/41; 437/40; 437/203; 357/23.3; 357/22
[58] Field of Search .................. 437/40, 41, 203; 357/22 A, 22 D, 23.2, 23.3

[56] References Cited

U.S. PATENT DOCUMENTS

| | | | |
|---|---|---|---|
| 3,823,352 | 7/1974 | Pruniaux et al. | 357/22 D |
| 4,163,237 | 7/1979 | Dingle et al. | 357/16 |
| 4,215,356 | 7/1980 | Kato | 357/22 D |
| 4,424,525 | 1/1984 | Mimura | 357/23 |
| 4,466,008 | 8/1984 | Beneking | 357/22 D |
| 4,568,958 | 2/1986 | Baliga | 357/23.2 |
| 4,636,824 | 1/1987 | Ikomo et al. | 357/23.3 |
| 4,641,161 | 2/1987 | Kim et al. | 357/22 |
| 4,663,643 | 5/1987 | Mimura | 357/16 |
| 4,677,457 | 6/1987 | Wolter | 357/16 |
| 4,688,061 | 8/1987 | Sakaki | 357/22 A |
| 4,698,654 | 10/1987 | Kohn | 357/22 D |

FOREIGN PATENT DOCUMENTS

| | | | |
|---|---|---|---|
| 0032173 | 2/1984 | Japan | 437/40 |
| 0280673 | 12/1986 | Japan | 437/40 |
| WO87/07432 | 12/1987 | PCT Int'l Appl. | |

OTHER PUBLICATIONS

Kizilyalli et al., *COMPEL* 6:93-97 (1987), "Dynamics of Electron Transfer Between Two Adjacent Channels as Calculated by an Ensemble Monte Carlo Method".
"Fabrication Technology for Monolithic GaAs VFET's", Clarke et al., *Proceedings IEEE/Cornell Conference on Advanced Concepts in high speed semiconductor devices and circuits*, (1987).
*Gallium Arsenide Technology*, Howard W. Sams & Co., Inc., Chapter 4, (1985).
Geis et al., *J. Vac. Sci. Technol.* 19:1390 (1981), "A Novel Anisotropic Dry Etching Technique".
Lincoln et al., *J. Vac. Sci. Technol.* B1, 1043 (1983), "Large Area Ion Beam Assisted Etching of GaAs with High Etch Rates and Controlled Anisotropy".
Goodhue et al., in *Gallium Arsenide and Related Compounds 1986*, Lindley (ed), Inst. Phys. Conf. Ser. 83 Briston, 1987, p. 349 "Angular Chlorine Ion-Beam-Assisted Etching of GaAs and AlGaAs".
Nulman et al., *Proceedings IEEE/Cornell Conference on Advanced Concepts in Highspeed Semicondutor Devices and Circuits* 271-279, (1985).
Asai et al., *Appl. Phys. Lett.* 51:1518-1520 (1987), "Narrow Two-Dimensinal Electron Gas Channels in GaAs-/AlGaAs Sidewall Interfaces by Selective Growth".
Frensley et al., *IEEE Transactions on Electron Devices* 32:952-956 (1985), "Design and Fabrication of a GaAs Vertical MESFET".
Mishra et al., IEDM Tech. DIG. 594-597 (1982), "Submicron GaAs Vertical Electron Transistor".
Luryi and Capasso, *Appl. Phys. Lett.* 47:1347-1349 (1985), "Resonant Tunneling of Two-Dimensional Electrons Through a Quantum Wire: a Negative Transconductance Device".

*Primary Examiner*—Brian E. Hearn
*Assistant Examiner*—Tuan Nguyen
*Attorney, Agent, or Firm*—Hamilton, Brook, Smith & Reynolds

[57] ABSTRACT

Horizontal and vertical transistors, such as, HEMT/SDHT devices are described with opposed gates for preventing substrate leakage current along with the methods for making same. Also a process for making single gate angled V-HEMT devices is described.

7 Claims, 9 Drawing Sheets

HIGH MOBILITY TRANSISTOR WITH OPPOSED-GATES

GOVERNMENT SPONSORSHIP

The U.S. Government has rights in this invention pursuant to Air Force Contract No. F19628-85-C-002.

BACKGROUND ART

This invention relates, in general, to semiconductor devices and, in particular, to gate controlled transistors with high mobility. Mobility is the velocity acquired by charge carriers (electrons or holes) per unit strength of applied electric field. In semiconductors, normal carrier mobility ranges from $10^2$ to $10^5$ cm$^2$-V$^{-1}$sec$^{-1}$. A materials conductivity is the product of the charge, the mobility and the carrier concentration.

A semiconductor in which the concentration of charge carriers is characteristic of the material itself rather than of the content of impurities and structural defects of the crystal is called an intrinsic semiconductor.

In an ideal intrinsic semiconductor, mobility is determined by lattice scattering; that is, collisions between lattice waves (phonons) and electron waves (electrons). In an actual intrinsic specimen there are always some impurity atoms which may dominate scattering at low temperatures when phonons are quiescent, but at higher temperatures lattice scattering, particularly by optical phonons, is dominant. At cryogenic temperatures (e.g., T=4° to 77° K.) ionized impurity scattering does indeed dominate mobility. In addition, the theory of Brooks and Herring predicts, and an experiment confirms, that as a result of electron-electron scattering at a given temperature, mobility decreases with increasing impurity concentration, and for each doping level there is a theoretical maximum mobility. Finally, it is known that, in general, the mobility of electrons (and hence n-type semiconductors) is greater than the mobility of holes (and hence p-type semiconductors).

A highly doped n-type semiconductor, therefore, typically suffers from low mobility both at low temperatures (e.g., 4° K.) due to ionized-impurity scattering from donors used to dope the specimen, and at high temperatures (e.g., 300° K.) due to electron-electron scattering and electron-phonon scattering. Thus the highest mobility semiconductors tend to be low doped so as to reduce both electron-electron scattering and ionized impurity scattering. But low doping levels cause commensurately low conductivity at room temperature due to a dearth of carriers and at cryogenic temperatures due to carrier freeze-out.

Consider the compound III-V semiconductor GaAs as an example. N-type GaAs samples typically exhibit room temperature mobilities of about 6,800 to 2,800 cm$^2$V$^{-1}$sec$^{-1}$ for doping levels of $10^{15}$ to $10^{18}$/cm$^3$. But mobility is highly temperature dependent. A GaAs sample doped to $10^{17}$/cm$^3$ may have a mobility of several thousand at room temperature, but at helium temperatures the mobility may be less than a hundred. Extremely high mobilities in GaAs (e.g., $10^5$cm$^2$V$^{-1}$sec$^{-1}$) have been attained by vapor phase epitaxy in isolated cases by utilizing extremely low doped samples (e.g., $10^{13}$/cm$^3$). As mentioned previously, however, GaAs with such low doping levels suffers from low conductivity.

Dingle et al. in U.S. Pat. No. 4,163,237 disclose a GaAs seminconductor device with enhanced mobility achieved by fabricating the semiconductor in the form of relatively narrow bandgap (GaAs) semiconductor layers separated by wider bandgap (AlGaAs) semiconductor layers. The layers exhibit a conduction or valence band step sufficiently large to confine electrons or holes, respectively, to the narrow bandgap layers. In addition, adjacent narrow and wide bandgap layers are substantially lattice-matched so that the heterojunctions formed at the interfaces therebetween are substantially defect free. An essential feature is that the wider bandgap layers are doped such that the impurity concentration-thickness product therein is greater than the same product in the narrower bandgap layers. Preferably, the narrow bandgap layers are doped n-type to a level which satisfies the foregoing product criterion.

The effect of the multilayered structure is to produce a potential or "quantum" well into which carriers flow from the adjacent wide bandgap layers. The wide bandgap layers become depleted of carriers which accumulate in the narrow bandgap layers as the multilayered structure is being fabricated. Because the narrow bandgap layers are undoped or unintentionally doped, the number of ionized impurities therein is extremely small compared to the number of carriers which will accumulate therein as long as the wide bandgap layers are doped such that the impurity concentration-thickness product therein exceeds the same product in the narrow bandgap layers.

As a result, the carriers, which are confined to the narrow bandgap layers by the heterojunctions formed at the interfaces with the adjacent wide bandgap layers, experience relatively little scattering from ionized impurities. The multilayered structure as a whole exhibits generally higher mobilities than are attainable in bulk samples of the narrow bandgap semiconductor material.

Because the heterojunction barriers are not infinitely high in energy, there is a finite quantum-mechanical probability that carriers may penetrate a few Angstroms into the wide bandgap material where ionized impurities are present. Thus to further reduce ionized impurity scattering, and further enhance mobility, in the event that such carrier penetration should occur, the doping of the wide bandgap layers is terminated short of the heterojunctions so as to leave thin (e.g., 10–60 Angstorms) buffer zones.

Mimura in U.S. Pat. No. 4,424,525 extended the Dingle et al. concept to produce a high electron mobility transistor in the form of a single active heterojunction device. The heterojunction is formed between a pair of layers fabricated with two different semiconductors having different electron affinities i.e. GaAs and AlGaAs. The "electron affinity" of a material is the difference between the lowest allowed energy state of an electron in a vacuum and its lowest allowed energy state in the conduction band of the material. In Mimura, the semiconductor layer having the lower electron affinity is doped with an n-type impurity. Due to the difference in electron affinity, electrons contained in the semiconductor layer having the lower electron affinity are depleted and move to the semiconductor layer having the higher electron affinity.

The electrons accumulate in an extremely thin region close to the single heterojunction. These accumulated electrons provide a channel. The entire quantity of the electrons are confined in an extremely thin region with a thickness of several tens of Angstroms and are spatially separated from the doped n-type impurity atoms.

This means the electrons suffer less from ionized-impurity scattering. Therefore, the mobility of the electrons is significantly improved particularly at cryogenic temperature at which the effect of ionized-impurity scattering becomes dominant in determining the electron mobility. On the other hand, the electron source region is depleted to some extent. When the thickness of the electron source region is selected to a proper magnitude, it is possible to make the electron source region entirely depleted. As a result, the electrons accumulated along the single heterojunction function as the only channel for the layer configuration consisting of an electron source region and a channel region. Accordingly, when one or more insulated gates or Schottky barrier gates together with a source and a drain are placed on the top surface of the layer configuration a Field Effect Transistor (FET) is produced with a path of electric current limited to the channel formed of the electrons accumulated along the single heterojunction.

High Electron Mobility Transistors of the type described above in Mimura are referred to by the acronym HEMT. They are also sometimes referred to by the acronym SDHT for Selectively Doped Heterojunction Transistor.

In more generalized terms the HEMT or SDHT uses a "potential" or "quantum" well for electron conduction. This potential well is created by the band-gap discontinuity in the conductive band between two epitaxially grown layers of different composition, electron affinity, and doping.

A typical HEMT structure comprises an active channel layer of high electron affinity material (GaAs), about 1 micron thick, which is formed on the top surface of a n-type doped or undoped buffer layer (GaAs) which is formed on a semi-insulating substrate (GaAs). On top of the active layer a thin (20–60 Å) layer of undoped lower electron affinity material (AlGaAs), called the "setback" or "spacer" is grown. An $n^+$ donor layer of lower electron affinity material (AlGaAs) is then grown over the spacer layer. A capping layer of highly doped GaAs is grown over this donor layer to passivate the AlGaAs and facilitate ohmic contact. Gate metallization is then applied over the channel region and ohmic contacts applied to the drain and source regions.

Electrons supplied from the dopant atoms in the higher electron affinity AlGaAs donor layer drop into a triangular "potential well" formed in the undoped higher electron affinity GaAs channel to form a two-dimensional electron gas region, sometimes referred to as a "2 DEG". See Chapter 4 Gallium Arsenide Technology, Howard W. Sams & Co., Inc. (1985) incorporated herein by reference, for a more complete state-of-the-art summary of SDHT or HEMT devices.

Several problems exist with respect to conventional planar HEMTs. Chief among these is the occurrence of substrate leakage current. In conventional HEMTs, voltage applied to a gate electrode controls the current flow from source to drain ($I_{SD}$). Preferably, the pinch-off voltage, i.e., the gate voltage required to completely stop $I_{SD}$, should be as low as possible. Unfortunately, some leakage current always occurs, since electrons, though driven deeper and deeper into the underlying HEMT substrate by higher and higher gate voltages, will always find a leakage path from the source to the drain. Consequently, a need exists for an HEMT with good pinch-off characteristics, i.e., low pinch-off voltage which would preferably totally eliminate substrate leakage current.

DISCLOSURE OF THE INVENTION

The present invention relates to a transistor and method of forming such transistor with one or more gate electrodes. In centain preferred embodiments, the gate electrodes are disposed opposite each other on heavily doped low electron affinity material between which is sandwiched higher electron affinity material. Drain and source ohmic contacts are affixed to opposite ends of the high electron affinity material. In a preferred embodiment, the low electron affinity material is formed of $n^+$-type doped AlGaAs and the high electron affinity material is lightly doped or undoped GaAs. An optional capping layer of $n^+$ GaAs may be applied over the AlGaAs to passivate the external surfaces thereof and prevent the AlGaAs from oxidizing.

Two alternate embodiments of the opposed-gates version of the invention will be described; a vertical (V)-HEMT and a horizontal (H)-HEMT. In the V-HEMT, the channel region between opposed gates, through which $I_{SD}$ flows, extends transverse or vertically from a planar or horizontal substrate. In the H-HEMT, the channel region extends horizontally, i.e., parallel to the planar substrate surface.

In the V-HEMT embodiment, either an undoped or n-type doped central channel region of high electron affinity material (GaAs) extends in vertical columns over a layer of $n^+$ doped high electron affinity buffer layer of (GaAs) grown on a semi-insulating or $n^+$ doped high electron affinity material (GaAs) substrate.

The vertical columns are formed by etching material away on either side of the columns down to the $n^+$ doped high electron affinity layer, i.e., $n^+$ GaAs layer. Next, a new layer of undoped high electron affinity material (GaAs) is regrown over the columns and between the columns, and on the sidewalls of the columns. A layer of $n^+$ doped low electron affinity material (alGaAs) is then grown over the columns and between the columns.

Shadow metal evaporation is used to form ohmic (drain/source) contacts on the top of the columns and self-aligned gate contacts on each vertical sidewall of the columns. Ohmic (drain/source) contacts are evaporated onto the bottom of the substrate.

The $n^+$ AlGaAs layer passivates the sidewalls against parasitic surface depletion and induces formation of a 2 DEG at the $n^+$ AlGaAs/undoped GaAs interface. Flow of electrons in the vertical portions of the 2 DEG is controlled by the presence or absence of an electrostatic field established by a voltage applied to the metal gates deposited on the sidewalls.

In a preferred embodiment, the central portions of the channels; that is, the original GaAs column, is doped n-type. In this embodiment, high electron mobility transistor behavior occurs with positive gate voltages, while field-effect transistor behavior occurs with negative gate voltages.

In an alternate embodiment, each GaAs channel is made quite narrow (i.e., 1000 Å or less). Lower drain current results, but higher peak transconductance and better pinch-off characteristics are produced.

Lastly, a simplified method for producing a single gate electrode V-HEMT will be described.

BEST MODE OF CARRYING OUT THE INVENTION

In the following detailed description, we have used alloys of III–V materials, such as AlGaAs, to illustrate the low or lower electron affinity material vis-a-vis III–V materials, such as GaAs, for the high or higher electron affinity material. Clearly, other lattice-matched materials may be substituted therefore, such as GaAs-AlGaAsP; InP-InGaAsP; InP-InGaAs; or InAs-GaAsSb. Mimura supra lists other possible pairings, such as, Ge-AlGaAs; Ge-GaAs; InSb-CdTe and InAs-GaSb, which include II–VI and IV–III/V material combinations.

I. TRANSISTOR WITH OPPOSED-GATES

Figure 1:
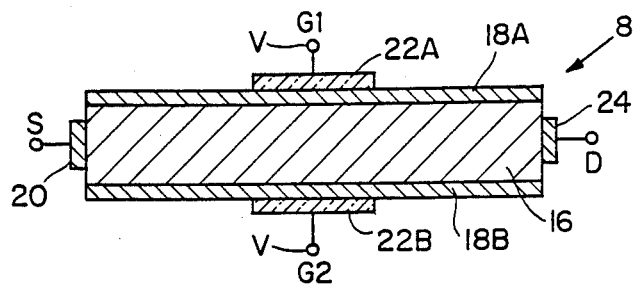
FIG. 1 is a schematic of an opposed gates transistor of the invention.

A generalized opposed gates transistor 8 of the invention is shown in schematicized form in FIG. 1. Transistor 8 includes a central channel body 16 of high electron mobility material, such as lightly doped or undoped GaAs 16. Body 16 is disposed between two layers 18A and 18B of n+-type doped lower electron affinity material, such as AlGaAs. A pair of ohmic contacts 20 and 24, which serve as the Source (S) and Drain (D) electrodes, are formed at either end of body 16. Finally, opposed Schottky barrier type non-ohmic contacts 22A and 22B, forming gate electrodes G1 and G2, are provided on the exterior side of the AlGaAs layers 18A and B.

The n+ AlGaAs layers 18A and 18B passivate the GaAs body, preventing surface depletion of the channel region between gates G1 and G2. At the interface between the n+ doped layers 18A and B with higher electron affinity body 16, a two dimensional electron gas (2 DEG) is formed. Current flowing in this region from source to drain is controlled by the voltage V at gates G1 and G2. Unlike prior art devices with only one gate electrode controlling pinch-off, the two gates of the present device cooperate so that electrons attempting to bypass gate G1's deflecting voltage and pass from source to drain are met by a corresponding potential or electrostatic field from gate G2, which effectively pinches off current flow completely.

The above generalizied description of the invention will now be described in further detail in two versions, along with the methods of forming such embodiments.

II. VERTICAL TRANSISTOR WITH OPPOSED-GATES

FIGS. 2a–2d is a series of idealized cross-sectional views of the vertical transistor with opposed-gates of the invention in the form of a V-HEMT in progressive stages of fabrication. Like items in FIGS. 2a–2d carry corresponding reference numerals from FIG. 1.

Figure 2A:
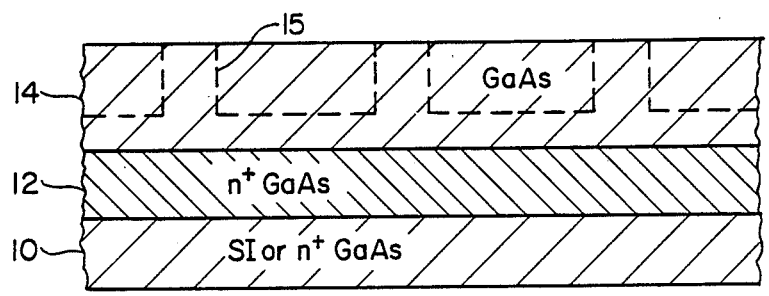
FIGS. 2a–2d are a series of schematicized cross-sectional views showing the method of fabricating a vertical transistor structure in accordance with the invention.

In FIG. 2a, the precursor structure is shown. It is comprised of a substrate 10 of epitaxial semi-insulating (SI) or n+ GaAs, upon which a layer 12 of about 4 microns of epitaxial n+ GaAs is formed, followed by a 0.5–1 micron thick layer 14 of undoped or doped GaAs.

Figure 2B:
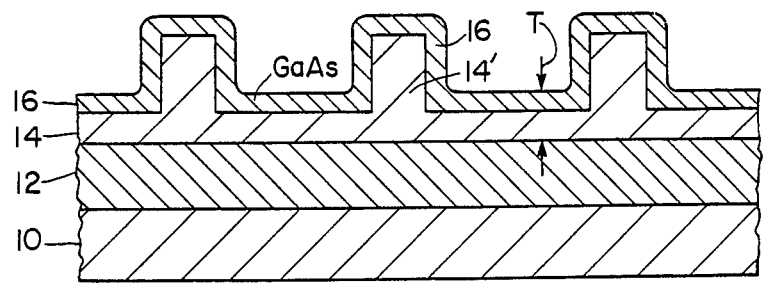

The layer 14 is etched along the dotted lines 15, leaving columns or fingers 14′ extending vertically from the remaining layer 14 (See FIG. 2b). The remaining layer 14 is about 0.1 microns thick, making the vertical columns 14′ about 0.4–0.9 microns high. Next, a layer 16 of undoped GaAs about 0.05–0.1 microns thick is regrown over the GaAs columns 14′.

The thickness T of layers 14 and 16 depends upon a tradeoff between the maximum drain source current ($I_{DS}$) attainable and the maximum gate-to-drain voltage $V_{DG}$ attainable without avalanche breakdown. The greater T, the greater $V_{DG}$ and lesser $I_{DS}$. Conversely, the smaller T, the greater $I_{DS}$ and lesser $V_{DG}$.

Figure 2C:
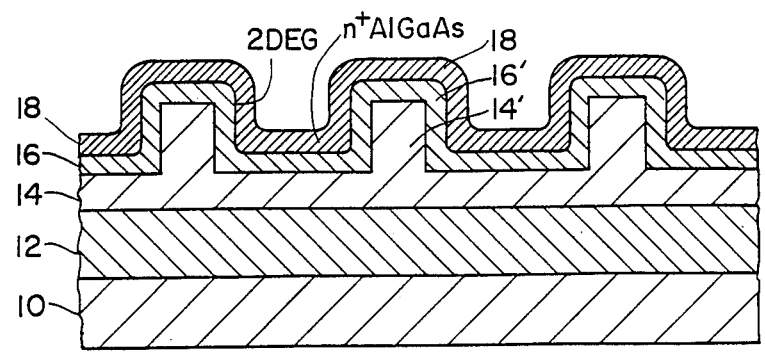

A roughly 400 Å thick layer 18 of lower electron affinity material, which is heavily doped n-type (i.e., n+ AlGaAs), is then formed on the undoped GaAs layer 16 (See FIG. 2c). The n+ AlGaAs layer passivates the sidewalls of the columns 14′ against parasitic surface depletion. The n+ AlGaAs also induces formation of a two-dimensional electron gas (2 DEG) at the interface between the lower electron affinity AlGaAs material layer 18 and the higher electron affinity GaAs material layer 16; thereby providing the necessary conditions for high electron mobility transistor operation. An optional layer (not shown) of n+ GaAs may be applied over the AlGaAs layer 18 to prevent oxidation of the AlGaAs.

Figure 2D:
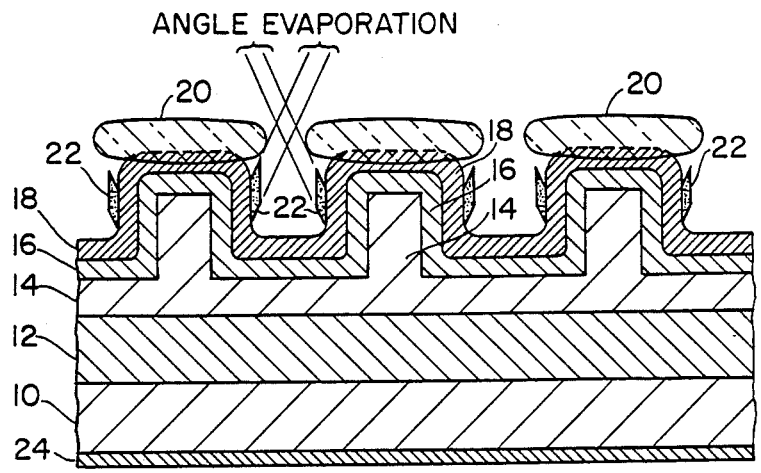

Next, as shown in FIG. 2d, ohmic contacts 20 of NiGeAu are angle evaporated onto the tops of the columns 14′ forming a self-aligned mask structure for subsequent gate formation. After annealing the ohmic contacts 20; gate electrodes 22 of tungsten are formed on the sidewalls of the columns. Two angle evaporations are used with the ohmic contacts 20 serving as a shadow mask.

The gate dimensions and placement relative to the top contact 20 are controlled by the angle of evaporation, length of the evaporation run, and the geometry of the top contact, rather than by lithography. An ohmic contact 24 of NiGeAu is also evaporated onto the bottom of substrate 10. An n+ layer of GaAs will suffice if substrate 10 is SI GaAs.

Figure 3:
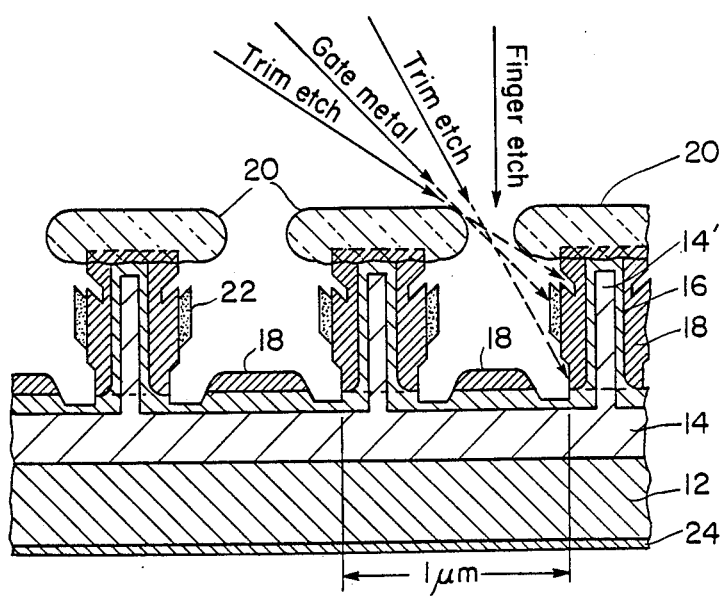
FIG. 3 is a schematic side view showing the procedure used to form the ohmic contacts, self-aligned gates and adjust pinch-off voltage of the V-HEMT.
Figure 4:
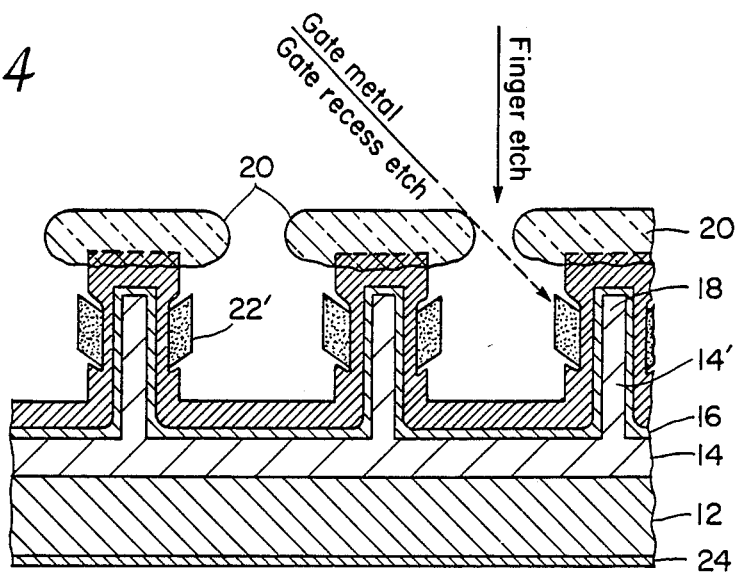
FIG. 4 is a schematic side view of an alternate embodiment in which the pinch-off voltage is adjusted before the gates are applied.

Preferably, a vertical chlorine ion beam assisted etch (IBAE) method is used to etch the columns. IBAE is described in *J. Vac. Sci. Technol.* 19. 1390 (1981), M. W. Geis, G. A. Lincoln, and W. J. Piacentini; *J. Vac. Sci. Technol.* B1, 1043 (1983), G. A. Lincoln, M. W. Geis, S. W. Pang and N. N. Efremow; and *Gallium Arsenide and Related Compounds* 1986, edited by W. T. Lindley (Inst. Phys. Conf. Ser 83, Briston, 1987), p. 349, W. D. Goodhue, G. D. Johnson and T. H. Windhorn. Optimally, as shown in FIG. 3, angle chlorine IBAE may be used to etch away n+ AlGaAs material 18 above and below the gate electrodes 22 to adjust the pinch-off voltage of the columns 14'. Alternatively, as shown in FIG. 4, the n+ AlGaAs material 18 may be removed in the region of the gates by IBAE; then the gates 22' may be angle evaporated into the recesses so formed.

The combined thickness of the GaAs column 14' and 16 is in the order of 1000 Å to 2000 Å. The AlGaAs 18 is in the order of 400 Å thick and the gates 22 may be recessed in the AlGaAs up to, but not through, this layer.

Preferably, the various layers are formed on the substrate by Molecular Beam Expitaxy (MBE) or Organometallic Chemical Vapor Deposition (OMCVD) processes. However, other well known techniques, such as LPE, IBD, etc. are contemplated. A suitable n-type dopant for the AlGaAs and GaAs layers is silicon.

Figure 5:
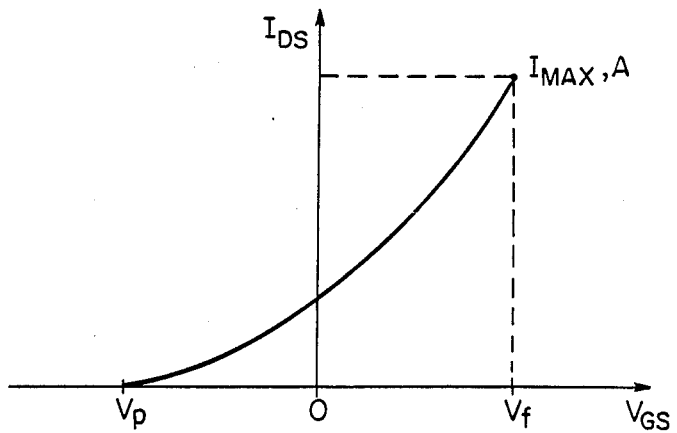
FIG. 5 is a current (I) versus voltage (V) curve of a HEMT structure in which the central channel is doped and/or the gates are not recessed.
Figure 6:
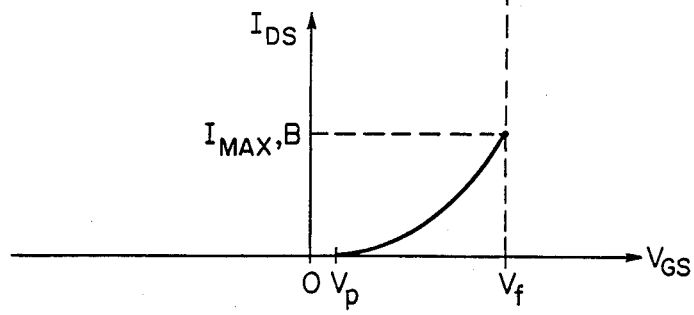
FIG. 6 is a IV curve in which the central channel is undoped and/or the gates are recessed.

The drain source current $I_{DS}$ versus gate-source voltage $V_{DS}$ (IV) characteristics of an opposed gates HEMT, as described above, are shown in FIGS. 5 and 6. In the FIG. 5 curve, the central GaAs channel 14 is doped and/or the gates are not recessed as in FIG. 3. In FIG. 6, the central GaAs channel 14 is undoped and/or the gates are recessed into AlGaAs layer 18, as in FIG. 4. A comparison of the two curves shows the tradeoffs available in constructing the device.

With a doped central channel and/or non-recessed gate (FIG. 5), the pinch-off voltage $V_p$ shifts towards more negative voltage values. As a result, the maximum current is greater in the FIG. 5 curve than in the FIG. 6 curve. This increase in $I_{max}$ in the doped channel case is attributable to the difference in degree of extension of the depletion region adjacent the gates into the channel for a given $V_{GS}$. As channel doping is increased, the depletion region extends less and vice versa. Note that the term $V_F$ in the figures is the forward turn-on voltage for a gate Schottky barrier, i.e., the voltage above which the gates draw significant forward current.

In addition to good pinch-off characteristics and absence of substrate leakage current, the V-HEMT above described has a number of significant advantages over prior art horizontal structures.

These advantages include, inter alia, higher output impedance, short gate length, more readily achievable narrow gate to source and/or drain to source spacing for higher speed and reduction of parasitics. Where the drain is on the bottom of the substrate and the source is on top of the columns, the gate to drain capacitance is relatively low. In the V-HEMT, the lower the source resistance, the higher the transconductance. Because of its compact geometry, the V-HEMT can be made with a high density factor, thereby avoiding size-related phase effects. Thus, at a given high frequency, more power is attainable than in an equivalent horizontal structure. The frequency at which power gain and current gain equals unity is expected to be higher than in comparable horizontal prior art structures.

III. HORIZONTAL TRANSISTOR WITH OPPOSED-GATES

Figure 7A:
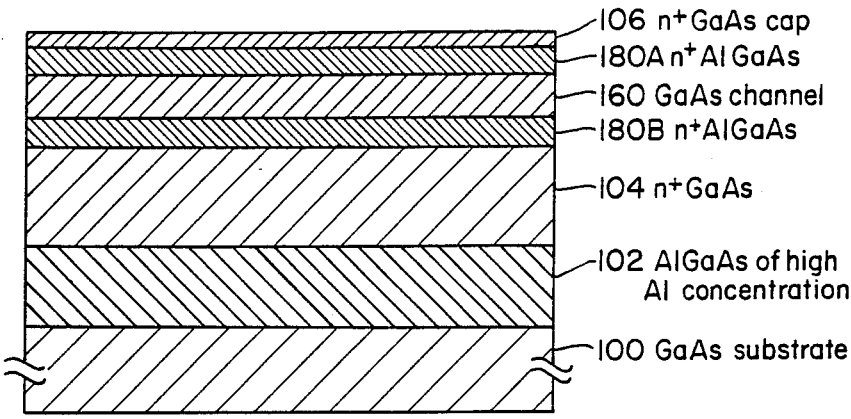
FIGS. 7a–7g are a series of schematicized cross-sectional views showing the method of forming a horizontal transistor structure in accordance with the invention.

A horizontal analog of the vertical structure shown in FIGS. 2a-d will now be described in connection with FIGS. 7a-7g. The finished device is a horizontal transistor with opposed gates 80, as shown in FIG. 7g. The starting structure is shown in FIG. 7a. It consists of a series of layers grown on a gallium arsenide substrate 100 by MBE or OMCVD processes. The first layer is an AlGaAs layer 102 of high aluminum concentration which will serve as an etch stop in the subsequent processing of the wafer.

Next, an n+ GaAs layer 104 is formed over the etch stop layer 102. Layer 104 serves as a passivating layer for the low electron affinity layer 180B of n+ AlGaAs, which is formed over layer 104.

A GaAs channel layer 160, of higher electron affinity material, is formed on layer 180B; followed by another layer of lower electron affinity material 180A comprising n+ AlGaAs. Lastly, a passivating layer of n+ GaAs forms a capping layer 106.

Figure 7B:
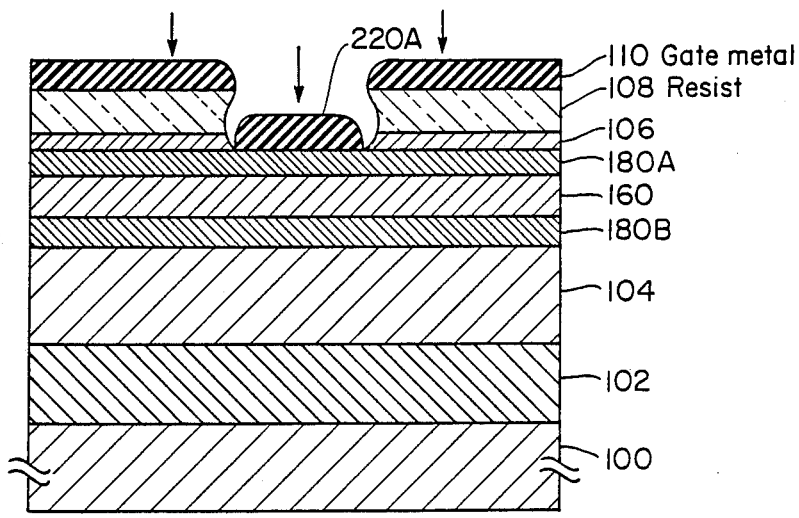

The wafer of FIG. 7a is then processed as in FIG. 7b by applying a resist layer 108 on top of the cap 106. The resist may comprise polymethylmethacrylate (PMMA). A gate electrode slot is then opened in the PMMA 108 using X-ray, E-beam, or ion beam lithography. A recess etch is then formed in the slot to remove cap layer 106. Optionally, if recess of the gate into the AlGaAs is desired, the recess etch may continue into layer 180A. A wet or dry process may be used. For the wet process, a solution of diluted $NH_4OH/H_2O_2$ may be used as the etchant. Alternatively, for the dry process a plasma etch, using $CCl_2F_2$ may be employed.

Next, the gate metallization is evaporated onto the top of the wafer. Typically, this would comprise a tungsten metallization. As may be seen in FIG. 7b, the metal layer 110 forms on top of the resist and on the AlGaAs layer 108A, but not on the sidewalls of the recess. The metallization in the recess comprises the gate electrode 220A formed on layer 180A. The remaining resist 108 is then dissolved and the excess gate metalization 110 is lifted off.

Figure 7C:
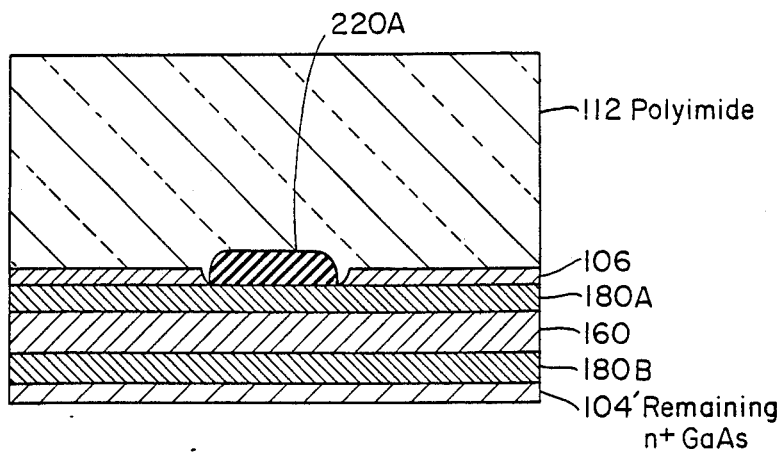
Figure 7D:
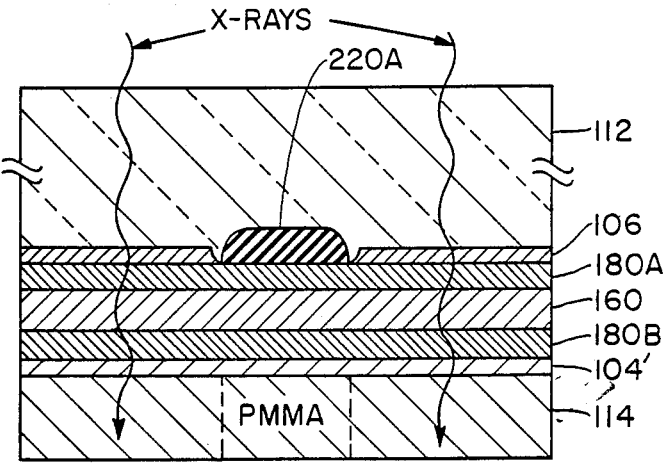

Next, as shown in FIG. 7c, the remaining layer 106 with the gate 220A centrally disposed within it, is coated with a support layer 112 of about 1-5 microns thickness. Layer 112 should consist of heat resistant dielectric material, such as polyimide or phosphosilicate glass or a suitable ceramic. The gallium arsenide substrate 100 is removed up to the high aluminum content etch stop layer 102, using a selective etching technique, such as $CCl_2F_2$ plasma. The n+ GaAs passivating layer 104 is carefully thinned to a final thickness using dilute $NH_4OH/H_2O_2$. The remaining thin layer 104' is then coated with PMMA 114 (See FIG. 7d). The opposite side from the PMMA 114 is exposed to X-rays which are absorbed by the tungsten gate electrode 220A casting a shadow on the PMMA 114 where the opposed gate should be located.

Figure 7E:
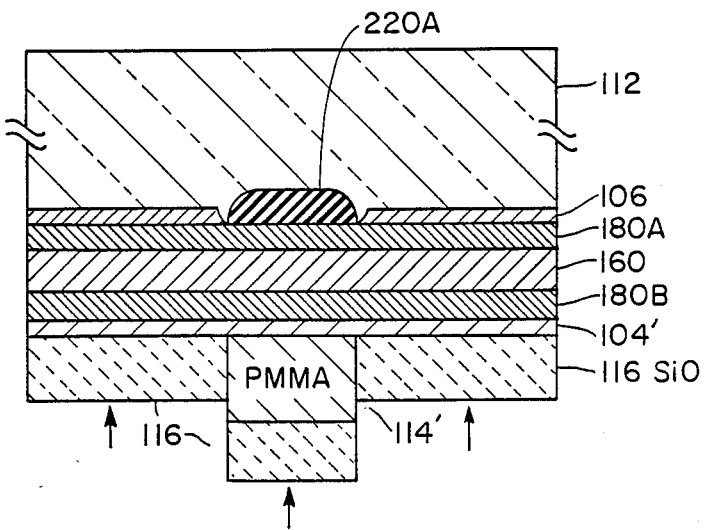

In FIG. 7e, the exposed PMMA is developed and removed leaving unexposed PMMA 114' where the gate should be located. An oxide mask of 116 is formed over the PMMA and layer 140' as shown in FIG. 7e. This mask is preferably comprised of evaporated silicon monoxide of $SiO_x$, wherein "x" is much smaller than 2.

Figure 7F:
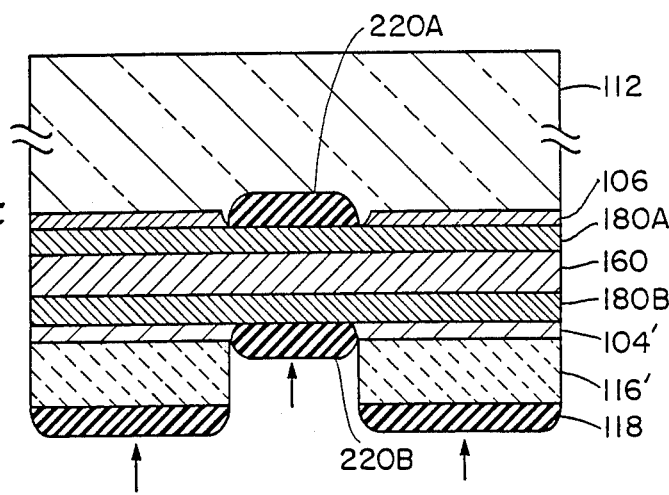
Figure 7G:
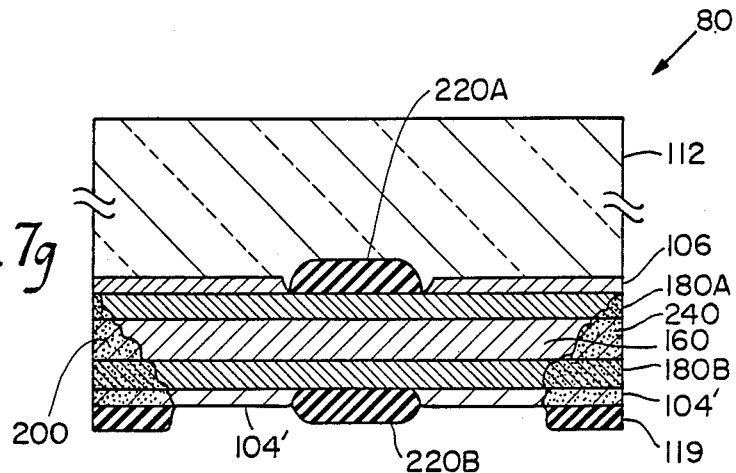

Next as shown in FIG. 7f, the unexposed PMMA 114' is dissolved by a long soak in a solvent, such as chlorobenzene and the silicon monoxide 116 over the PMMA 114' is lifted off. An etch gate recess is formed, as in FIG. 7b, in the passivating layer 104' opposite gate 220A. A tungsten gate evaporation is then performed to form gate electrode 220B in the recess in layer 104'. The remaining $SiO_x$ 116' is then dissolved in a hydrofluoric acid solution and the excess gate metallization 118 is lifted leaving the structure shown in FIG. 7g.

Source and drain ohmic contacts are then formed. First, using conventional lithography and lift off; Ni-GeAu contact regions 119 are formed on each end of the passivating layer 104'. These regions are then heat treated to alloy the contacts causing the material to diffuse into and make ohmic contact with the ends of the channel region 160, forming the requisite drain and source electrodes 200 and 240 at each end of the channel. Preferably a nickel germanium gold evaporation is used for the regions 119 but other metallization materials are contemplated.

In this manner, there is formed an opposed gate transistor structure 80 consisting of a central channel 160 of high electron affinity material, i.e., GaAs with heavily n-type doped low electron affinity material 180A and 180B on either side, consisting of n+ AlGaAs. Metal gates 220A and 220B of tungsten are formed on the n+ AlGaAs layers 180A and 180B in diametrically opposed relationship. A pair of n+ GaAs layers 106 and 104' serve to passivate the AlGaAs layers and prevent oxidation thereof. The polyimide 112 may be retained as a suppport structure for the thin transistor 80.

End contacts 200 and 240 for source and drain connections are formed on either end of the channel region 160.

IV. SINGLE GATE ANGLED V-HEMT

Figure 8A:
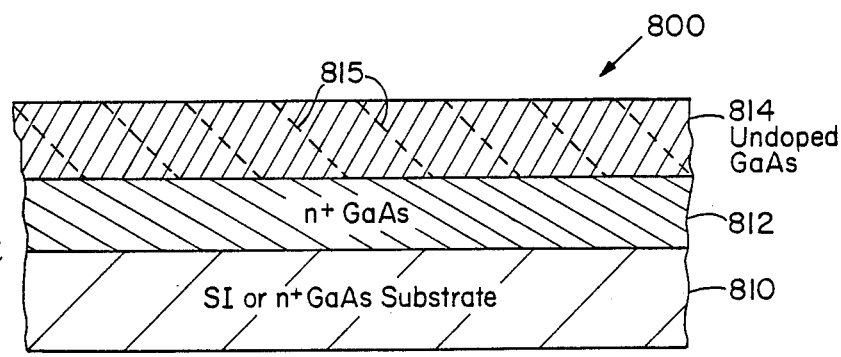
FIGS. 8a–8c are a series of schematicized cross-sectional views showing a simplified method of forming a single gate electrode V-HEMT.

An improved method of manufacturing a single gate vertical high electron mobility transistor 800 will now be described in connection with FIGS. 8a–8c. In this embodiment, a much simpler process is used to form an angled V-HEMT. In the first part of the process (see FIG. 8a), a precursor structure is formed by growing epitaxial layers 812 and 814, respectively, of n+ GaAs and undoped GaAs 814 on a suitable substrate 810 of semi-insulating or n+ GaAs. These layers are preferably grown by MBE or OMCVD.

Figure 8B:
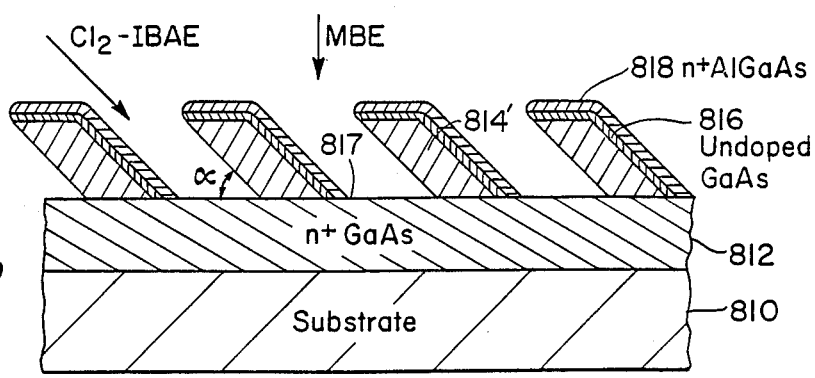
Figure 8C:
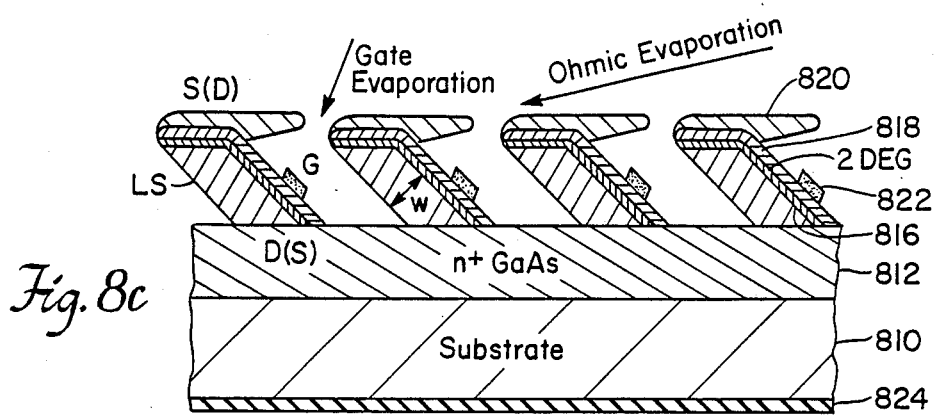

Next, the undoped GaAs layer 814 is etched by $Cl_2$ IBAE, leaving fingers 814' jutting out of layer 812 at an angle α (See FIG. 8b). The distance between fingers 814' and the angle α is such that the top of each of the fingers overlies the bottom of the next adjacent finger. Thus, when undoped GaAs and n+ AlGaAs layers 816 and 818, respectively, are grown by MBE on the fingers 814', no deposits occur in the space 817 left between fingers. Note, MBE, rather than OMCVD, should be used for this step, since OMCVD is apt to conformally coat the entire surface, despite the shadow cast by the fingers.

NiGeAu ohmic contacts 820 are then angle evaporated onto the top layer 818 of the fingers and tungsten metal gates 822 are angle evaporated onto the upper side walls of the fingers using the ohmic contacts 820 as a shadow mask. Finally, an ohmic contact layer 824 is formed on the bottom n+ layer 812 or substrate 810 (See FIG. 8c).

The width w across the channel region between one side of the GaAs forming the angled fingers 814' to the 2 DEG at the interface between layers 816 and 818 is preferably large enough so that surface depletion from the lower sidewall (LS) does not prevent or detract from the formation of the 2 DEG at the AlGaAs/GaAs interface on the upper sidewall. Conversely, w should be small enough that $I_{DS}$ can be pinched-off against the lower sidewall with a reasonable $V_p$. A "w" range in the order of 1000–2000 Å is recommended.

Note that pinch-off is more difficult in this embodiment because of the absence of a second gate electrode to pinch against. Nevertheless, the lower sidewall LS interfaces with air making this a superior "hard" surface to pinch against.

In this embodiment, only two angle evaporations are required, making the process easier to control, which should result in greater reproducibility and higher yield.

V. DUAL OPPOSED HORIZONTAL GATES V-HEMT

Figure 9A:
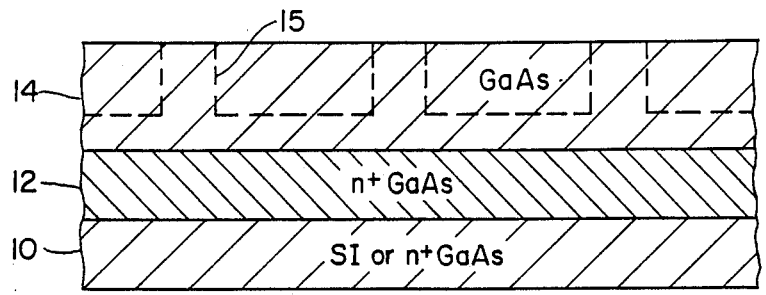
FIGS. 9a–9e are a series of schematicized cross-sectional views showing an alternate embodiment of a V-HEMT method.
Figure 9B:
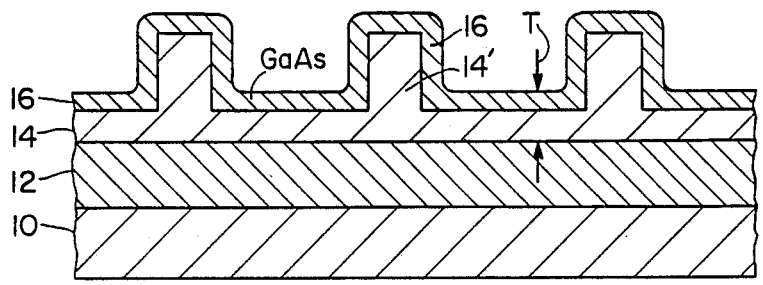
Figure 9C:
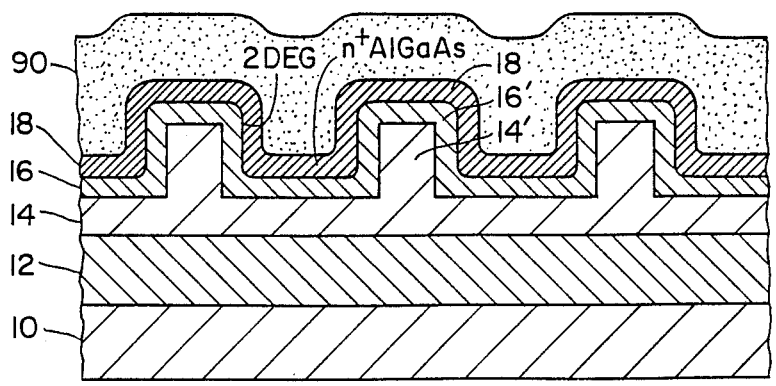
Figure 9D:
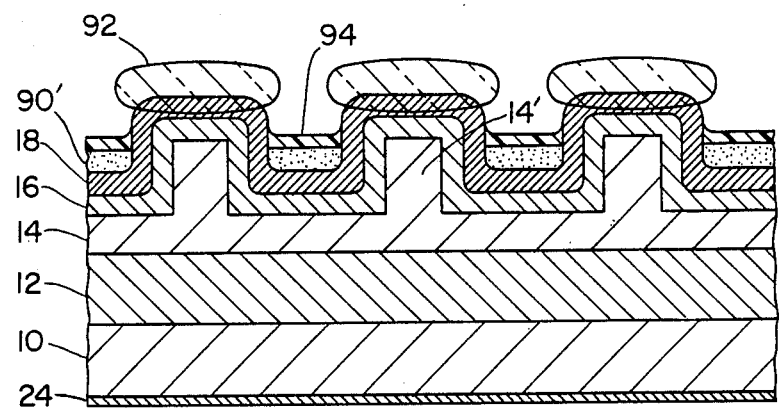

A further embodiment of the invention will now be described with the aid of schematic sectional drawings FIGS. 9a–9e, in which like items in FIGS. 2a–2d carry corresponding reference numerals. The starting structure and method shown in FIGS. 9a–9c is identical to that previously described in connection with FIGS. 2a–2c, except that in FIG. 9c, after the n+ AlGaAs layer 18 is formed, a conformal coating of photoresist 90 is formed over the top surface and into the spaces between columns. This resist is etched away, such as by an oxygen reactive ion etch treatment, down to about the midpoint of the vertical height of the columns, leaving a resist base 90' between columns. Next, an angle evaporation of NiGeAu is employed to form ohmic contacts 92 on the top of the columns. The gate electrodes are then formed by angle evaporation passes to extend tungsten gate metallization 94 over the insulative resist base 90' between the sidewalls of each column; as shown in FIG. 9d.

Optimally, to reduce parasitic capacitance, the resist base 90' may be removed by dissolving it in an acetone solvent. A drain/source ohmic contact 24 is formed, as before, on the bottom of substrate 10.

Figure 9E:
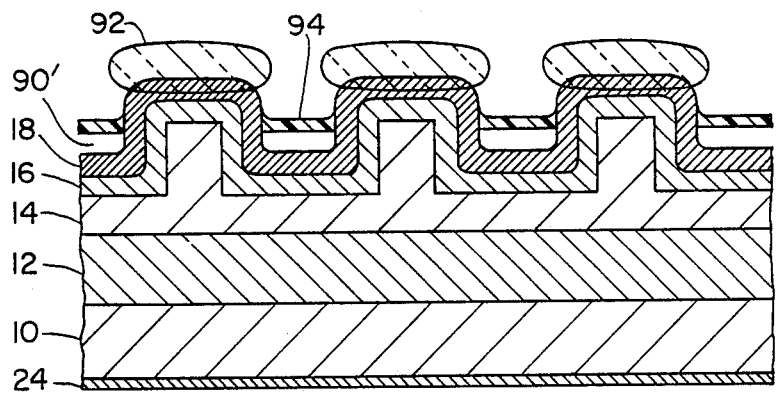

This device of FIG. 9e has attributes similar to that of FIG. 2d. In particular, the opposing gates 94 can completely pinch-off electron flow in the channel. The AlGaAs layer 18 is heavily doped and, therefore, sidewall depletion problems are avoided. Also, the effective gate length is small.

Equivalents

Those skilled in the art will recognize, or be able to ascertain employing no more than routine experimentation, many equivalents to the specific structures, steps, functions and materials described specifically herein, and such equivalents are intended to be encompassed within the scope of the following claims. For example, while the invention has been illustrated with n-type doping, the device is capable of operating with opposite type doping, i.e., p-type doping.

We claim:

1. The method of forming vertical transistors with opposed gates comprising the steps of:
    (a) forming a first layer of high electron affinity material on a substrate;
    (b) removing laterally adjacent portions of said first layer to provide spaced columns having top walls and sidewalls of high electron affinity material projecting orthogonal to said substrate;
    (c) forming a second layer of high electron affinity material on said top walls and sidewalls;
    (d) forming a third layer of heavily doped n-type low electron affinity material over said second layer;
    (e) forming ohmic contacts on the portions of the third layer overlying the top walls and on the bottom of the substrate;
    (f) forming gate electrodes on portions of the third layer adjacent the sidewalls.

2. The method of claim 1 wherein the gate electrodes are formed by angle evaporation using the ohmic contacts as a shadow mask.

3. The method of claim 2 wherein prior to formation of the gate electrodes, the third layer is recessed in the area where the gate electrode is formed.

4. The method of claim 1 wherein the portions of said first layer are removed in step (b) by a chlorine ion beam assisted etch.

5. The method of forming vertical transistors with opposed gates comprising the steps of:
 (a) forming a first layer of high electron affinity material on a substrate;
 (b) removing laterally adjacent portions of said first layer to provide spaced columns having top walls and sidewalls of high electron affinity material projecting orthogonal to said substrate;
 (c) forming a second layer of high electron affinity material on said top walls and sidewalls;
 (d) forming a third layer of heavily doped n-type low electron affinity material over said second layer;
 (e) coating said third layer with a dissolvable insulative material;
 (f) removing portions of said insulative material leaving a base of said material extending between the sidewalls;
 (g) forming ohmic contacts on the portions of the third layer overlying the top walls and on the bottom of the substrate;
 (h) forming gate electrodes on portions of the third layer, said gate electrodes extending between the sidewalls over said base.

6. The method of claim 5 wherein the gate electrodes are formed by angle evaporation.

7. The method of claim 5 wherein after formation of the gate electrodes, the insulative base material is dissolved.

* * * * *